United States Patent [19]

Higuchi et al.

[11] Patent Number: 5,940,688
[45] Date of Patent: Aug. 17, 1999

[54] EPOXY RESIN COMPOSITION AND SEMICONDUCTOR DEVICE ENCAPSULATED THEREWITH

[75] Inventors: Noriaki Higuchi; Takaaki Fukumoto, both of Chiyoda-ku; Toshio Shiobara, Usui-gun; Eiichi Asano, Usui-gun; Kazutoshi Tomiyoshi, Usui-gun, all of Japan

[73] Assignee: Shin-Etsu Chemical Co., Ltd., Japan

[21] Appl. No.: 08/919,242

[22] Filed: Aug. 28, 1997

[30] Foreign Application Priority Data

Aug. 29, 1996 [JP] Japan .................................. 8-247024

[51] Int. Cl.$^6$ ....................... H01L 21/302; H01L 21/463; C08L 63/00
[52] U.S. Cl. ............................................ 438/127; 523/443
[58] Field of Search ............................. 438/127; 523/443

[56] References Cited

PUBLICATIONS

Patent Abstracts of Japan, vol. 015, No. 425, Oct. 29, 1991 and JP 03 177450 A.

*Primary Examiner*—Kimberly Jordan
*Attorney, Agent, or Firm*—Millen, White, Zelano, & Branigan, P.C.

[57] ABSTRACT

In an epoxy resin composition comprising an epoxy resin, a curing agent, and 80–90 wt % of a particulate inorganic filler, fine particles having a particle size of less than 3 μm account for 10–40 wt % of the inorganic filler, and the inorganic filler has a specific surface area of less than 2.5 m$^2$/g as measured by a nitrogen adsorption BET method. The inorganic filler satisfies that when a blend of a bisphenol F type liquid epoxy resin having a viscosity of 30–45 poises at 25° C. as measured by Gardner-Holdt method with 75 wt % of the inorganic filler is measured for viscosity at 25° C. by means of an E type viscometer, the viscosity at a shear rate of 0.6 $s_{-1}$ is less than 50,000 poises and the ratio of the viscosity at a shear rate of 0.6 $s^{-1}$ to the viscosity at a share rate of 10 $s^{-1}$ is less than 2.5/1. The epoxy resin composition has a low melt viscosity enough to mold on semiconductor devices without die pad and wire deformation.

10 Claims, No Drawings

EPOXY RESIN COMPOSITION AND SEMICONDUCTOR DEVICE ENCAPSULATED THEREWITH

BACKGROUND OF THE INVENTION

1. Field of the Invention

This invention relates to an epoxy resin composition having a low melt viscosity enough to mold on a thin multi-pin semiconductor device without causing damages thereto and a semiconductor device encapsulated with a cured product of the composition.

2. Prior Art

For epoxy resin compositions serving as an encapsulant for modern thin packages, the current approach taken in order to find a compromise between filling improvement and low water absorption is to blend a large proportion of a submicron filler having a mean particle size of less than 1 $\mu$m, desirably less than 0.5 $\mu$m. Since such a submicron filler has an extremely greater specific surface area than conventional fillers, the interfacial wetting between the filler and the resin is significantly exacerbated. As a result, the composition has an extremely high viscosity and becomes difficult to mold.

Another recent approach is to increase the loading of a filler to reduce water absorption for the purpose of improving reflow soldering resistance. Particularly when the loading is more than 85% by weight, spherical fillers conventionally used can cause die pad deformation and wire deformation and even line failures because the viscosity of loaded resin in the low shear region becomes very high.

SUMMARY OF THE INVENTION

An object of the invention is to provide an epoxy resin composition which is low in melt viscosity and easy to mold, enabling the encapsulation of semiconductor devices without causing damages such as die pad deformation and wire deformation. Another object of the invention is to provide a semiconductor device encapsulated with the epoxy resin composition.

We made investigations on the inorganic filler which can be loaded in epoxy resin compositions in a large proportion. Prior art inorganic fillers prepared by conventional methods are not controlled with respect to the particle size and specific surface area of a fine region. When a large amount of such a conventional inorganic filler is loaded, the resulting resin composition experiences a rapid rise of viscosity in the low shear region, causing wire deformation. This problem is now considered serious. For the purposes of overcoming this problem and imparting a low viscosity to a resin composition with a high loading of inorganic filler, we studied the particle size distribution, specific surface area and shape of inorganic fillers. In the prior art proposals relating to conventional inorganic fillers, molding characteristics are governed by the particle size distribution, specific surface area and shape of inorganic fillers. We also rely on this principle. However, the relationships of moldability to various characteristics of a filler are not completely understood in the prior art. Merely controlling the particle size distribution, specific surface area and shape of an inorganic filler is not successful in preventing the above-mentioned problems from occurring in modern thin, multi-pin, large-size packages.

We have found that when a filler giving an appropriate ratio of viscosities at different shear rates is selected by blending fillers each having a certain particle size and specific surface area with a resin to form resin blends, measuring the viscosity of each blend at different shear rates, and calculating the ratio of viscosities at different shear rates, a resin composition loaded with that filler is easy to mold.

More particularly, we have found that in an epoxy resin composition comprising an epoxy resin, a curing agent, and an inorganic filler as essential components, when the inorganic filler in which fine particles having a particle size of less than 3 $\mu$m account for 10 to 40% by weight of the entire inorganic filler, the entire inorganic filler has a specific surface area of less than 2.5 $m^2$/g as measured by a nitrogen adsorption BET method, and provided that a blend of a bisphenol F type liquid epoxy resin having a viscosity of 30 to 45 poises at 25° C. as measured by Gardner-Holdt method with 75% by weight of the inorganic filler is measured for viscosity at 25° C. by means of an E type viscometer, the viscosity at a shear rate of 0.6 $s^{-1}$ is less than 50,000 poises and the ratio of the viscosity at a shear rate of 0.6 $s^{-1}$ to the viscosity at a share rate of 10 $s^{-1}$ is less than 2.5/1 is blended in an amount of 80 to 90% by weight of the composition, the composition is low in melt viscosity and easy to mold despite the high loading of the inorganic filler. Then, thin multi-pin semiconductor devices can be encapsulated therewith without inconvenience such as wire deformation.

According to the invention there are provided an epoxy resin composition comprising an epoxy resin, a curing agent, and an inorganic filler as essential components wherein the above-defined inorganic filler is blended in an amount of 80 to 90% by weight of the composition; and a semiconductor device encapsulated with a cured product of the epoxy resin composition.

DETAILED DESCRIPTION OF THE INVENTION

The epoxy resin composition of the invention contains an epoxy resin, a curing agent, and an inorganic filler as essential components.

The epoxy resin used herein may be selected from prior art well-known epoxy resins having at least two epoxy groups in a molecule, for example, bisphenol A type epoxy resins, bisphenol F type epoxy resins, phenol novolak type epoxy resins, cresol novolak type epoxy resins, naphthalene type epoxy resins, biphenyl type epoxy resins, phenol aralkyl type epoxy resins, and cyclopentadiene type epoxy resins. Preferred of these epoxy resins are naphthalene type epoxy resins, biphenyl type epoxy resins, and epoxy resins having a liquid crystal structure represented by either of the following structural formulae.

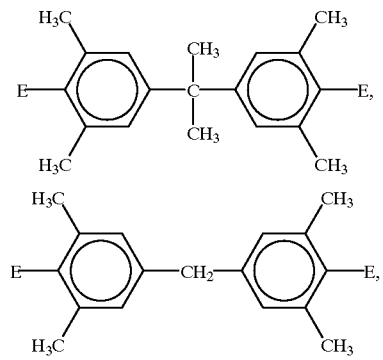

-continued

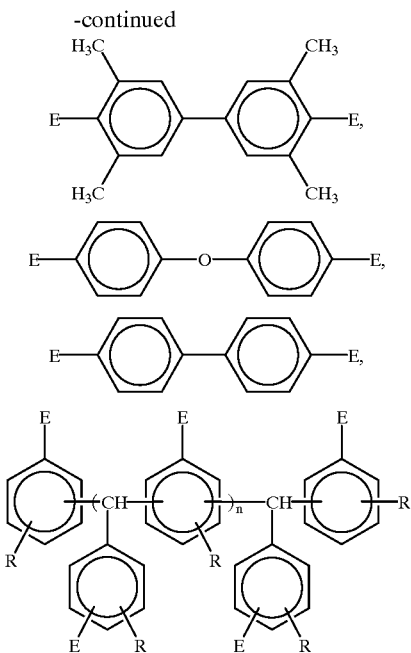

In the formulae, E is

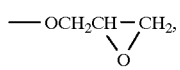

R is hydrogen or an alkyl group having 1 to 4 carbon atoms, such as methyl, ethyl, propyl, isopropyl, butyl, isobutyl and tert-butyl, and letter n is an integer of 0 to 5.

These epoxy resins should preferably have an overall chlorine content of less than 1,500 ppm, more preferably less than 1,000 ppm, and a water extractable chlorine content of less than 5 ppm as measured in an epoxy resin concentration of 50% by weight at 120° C. for 20 hours. If the overall chlorine content is more than 1,500 ppm and/or the water extractable chlorine content is more than 5 ppm, semiconductor devices encapsulated with such epoxy resins would become less reliable against humidity.

The curing agent may be selected from conventional well-known compounds used as a curing agent for epoxy resins, for example, phenol compounds, amine compounds and acid anhydride compounds. In particular, phenol resins having at least two phenolic hydroxyl groups in a molecule are useful. Exemplary phenol resins are phenol novolak resins, cresol novolak resins, phenol aralkyl resins, naphthalene type phenol resins, cyclopentadiene type phenol resins, and phenolic hydroxyl group-containing phenol resins of the following structure:

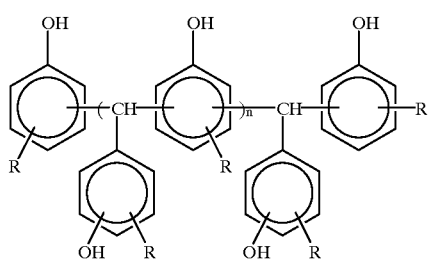

wherein R is hydrogen or an alkyl group having 1 to 4 carbon atoms, such as methyl, ethyl, propyl, isopropyl, butyl, isobutyl and tert-butyl, and letter n is an integer of 0 to 5.

Like the epoxy resins, the phenol resins should preferably have chloride and sodium ion contents of less than 10 ppm, especially less than 5 ppm when extracted at 120° C.

The curing agent is used in a sufficient amount to cure the epoxy resin. Where a phenol resin is used as the curing agent, the epoxy resin and the phenol resin are preferably mixed such that 0.5 to 1.6 mol, especially 0.6 to 1.4 mol of the phenolic hydroxyl group is available per mol of the epoxy group. Less than 0.5 mol of the phenolic hydroxyl group per mol of the epoxy group means a shortage of hydroxyl groups, which can lead to a greater proportion of homo-polymerization of epoxy groups and hence, a lower glass transition temperature. More than 1.6 mol of the phenolic hydroxyl group per mol of the epoxy group means a higher proportion of phenolic hydroxyl groups, which can lead to a lower reactivity, a lower crosslinking density and an insufficient strength.

In the epoxy resin composition of the invention, a curing promoter may be blended. The curing promoter may be selected from phosphorus compounds, imidazole derivatives, and cycloamidine derivatives. The amount of the curing promoter is preferably 0.01 to 10 parts by weight per 100 parts by weight of the epoxy resin and the phenol resin combined.

The inorganic filler used in the invention should satisfy the following conditions. (1) Fine particles having a particle size of less than 3 μm account for 10 to 40% by weight of the entire inorganic filler. (2) The entire inorganic filler has a specific surface area of less than 2.5 $m^2/g$ as measured by a nitrogen adsorption BET method. (3) When a blend of a bisphenol F type liquid epoxy resin having a viscosity of 30 to 45 poises at 25° C. as measured by Gardner-Holdt method with 75% by weight of the inorganic filler is measured for viscosity at 25° C. by means of an E type viscometer, the viscosity at a shear rate of 0.6 $s^{-1}$ is less than 50,000 poises and the ratio of the viscosity at a shear rate of 0.6 $s^{-1}$ to the viscosity at a share rate of 10 $s^{-1}$ is less than 2.5/1.

More particularly, the inorganic filler used herein has a particle size distribution that a fraction of fine particles having a particle size of less than 3 μm accounts for 10 to 40% by weight of the entire inorganic filler, desirably a particle size distribution that a finest fraction of particles having a particle size of 0.05 to 0.3 μm account for 1 to 10% by weight, a finer fraction of particles having a particle size of 0.4 to 0.7 μm accounts for 5 to 20% by weight, a fine fraction of particles having a particle size of 0.8 to 3 μm accounts for 5 to 20% by weight of the entire inorganic filler. If the fine particle fraction of less than 3 μm is less than 10% by weight, the close intimate filling of the composition with the filler is not expectable and the melt viscosity of the composition is not fully low. If the fine particle fraction of less than 3 μm exceeds 40% by weight, which means a higher proportion of finer particles, the interfacial wetting between the resin and the filler becomes insufficient and the melt viscosity of the composition increases. Desirably, the fine particle fraction of less than 3 μm in size accounts for 10 to 30% by weight of the entire inorganic filler.

The inorganic filler as a whole should preferably have a mean particle size of 4 to 30 μm. If the filler has a mean particle size of less than 4 μm, a resin composition loaded therewith would become too viscous, preventing high loading of the filler. If the filler has a mean particle size of more than 30 μm, a resin composition loaded therewith would cause gate blockage. Desirably, the inorganic filler has a particle size distribution with a maximum particle size of less than 100 μm, more desirably less than 74 μm.

It is noted that a fraction of filler particles having a particle size of less than 0.7 μm plays an important role in increasing the close filling of the filler, imparting thixotropy to a resin composition to reduce the viscosity thereof, and controlling the flow of a resin composition. The desired filler is a fine particulate filler having a particle size of 0.05 to 0.3 μm. The filler of this type is desirably spherical in shape and has a specific surface area of 10 to 50 $m^2/g$. The more desirable filler has a specific surface area of 15 to 40 $m^2/g$.

In the prior art, dry or wet ultrafine silica having an extremely large specific surface area of 100 to 300 $m^2/g$ as typified by aerosil is often used to impart thixotropy. Since the filler of this type has a large specific surface area, flow largely changes even when it is added in a small amount. The use of the filler of this type needs a careful control.

It is noted that the mean particle size and particle size distribution are measurements (e.g., weight average values) by a laser diffraction particle size distribution meter, for example, Granulometer 920 by CILAS ALCATEL (France).

According to the invention, the inorganic filler as a whole has a specific surface area of less than 2.5 $m^2/g$, desirably 1 to 2 $m^2/g$ as measured by a nitrogen adsorption BET method. If the specific surface area of the filler exceeds 2.5 $m^2/g$, a resin composition filled therewith becomes more thixotropic and difficult to mold.

According to the invention, the inorganic filler satisfies the condition that when a blend of a bisphenol F type liquid epoxy resin having a viscosity of 30 to 45 poises at 25° C.(±0.05° C.) as measured by Gardner-Holdt method with 75% by weight of the inorganic filler is measured for viscosity at 25° C.(±0.05° C.) by means of an E type viscometer, the viscosity $V_1$ at a shear rate of 0.6 $s^{-1}$ is less than 50,000 poises and the ratio of the viscosity $V_1$ at a shear rate of 0.6 $s^{-1}$ to the viscosity $V_2$ at a share rate of 10 $s^{-1}$ is less than 2.5/1, that is, $V_1/V_2 \leq 2.5$. If $V_1/V_2 > 2.5$, the viscosity of the resin flowing in the cavity becomes very high, causing wire deformation and die pad shifting. Such a rapid rise of resin viscosity in a low shear region can be effectively prevented by using a filler providing a viscosity ratio $V_1/V_2$ between 0.5 and 2.5, especially 0.8 and 2.2. The viscosity $V_1$ at a shear rate of 0.6 $s^{-1}$ is less than 50,000 poises, especially 5,000 to 30,000 poises. If $V_1$ exceeds 50,000 poises, an epoxy resin composition loaded therewith becomes too viscous to mold.

Blending the inorganic filler defined above in an epoxy resin forms an epoxy resin composition which has a melt viscosity of less than 200 poises at 175° C. and is easy to mold.

It is noted that the specific surface area of the inorganic filler largely affects the ratio of a viscosity at a low shear rate to a viscosity at a high shear rate. We have found that if the specific surface area is less than 2.5 $m^2/g$, then the viscosity ratio $V_1/V_2$ can be less than 2.5/1. Beyond this specific surface area limit, the interfacial wetting between the resin and the filler becomes insufficient, the viscosity becomes extremely high, and the viscosity ratio $V_1/V_2$ exceeds 2.5. The viscosity ratio $V_1/V_2$ is also affected by a fine filler fraction having a particle size of less than 0.7 μm, especially 0.05 to 0.3 μm. A particulate filler fraction of this region tends to agglomerate as a result of vibration and if secondary agglomeration occurs, its influence becomes more outstanding. Desirably, the filler is premixed with the resin in order to prevent secondary agglomeration and to fully wet filler particles with the resin at their interface.

The filler used herein includes fused silica obtained by pulverizing in a ball mill, spherical silica obtained by flame fusion, spherical silica obtained by a sol-gel method, crystalline silica, alumina, boron nitride, aluminum nitride, silicon nitride, magnesia, and magnesium silicate. Where semiconductor elements produce a considerable heat release, it is desirable to use fillers having a greater thermal conductivity and a lower coefficient of expansion such as alumina, boron nitride, aluminum nitride and silicon nitride. They may be blended with fused silica. The shape of the inorganic filler is not critical. Fillers of flake, dendrite and spherical shapes may be used alone or in admixture of two or more. Spherical particles are most desirable for viscosity lowering and higher loading. Preferably the filler is surface treated with silane coupling agents and titanium coupling agents prior to use.

The amount of the inorganic filler blended is about 80 to 90% by weight of the entire composition. Differently stated, about 400 to 1,000 parts by weight of the inorganic filler is blended per 100 parts by weight of the epoxy resin and the curing agent combined. Outside this range, epoxy resin compositions with less amounts of the inorganic filler would have a relatively high coefficient of expansion and a high water absorption, leaving the risk that packages crack at high temperature upon reflow soldering. Epoxy resin compositions with more amounts of the inorganic filler would become too viscous to mold.

Further, conventional well-known powders such as silicone rubber and gel, silicone-modified epoxy resins, silicone-modified phenol resins, and thermoplastic resins such as methyl methacrylate-butadiene-styrene copolymers may be blended in the epoxy resin composition as a stress reducing agent.

Also conventional well-known diluents having an epoxy or phenolic hydroxyl group may be added for reducing viscosity. Exemplary diluents include n-butyl glycidyl ether, phenyl glycidyl ether, styrene oxide, tert-butyl-phenyl glycidyl ether, dicyclopentadiene diepoxide, phenol, cresol, and tert-butylphenol.

Still further, coupling agents such as silane coupling agents, titanium coupling agents, and aluminum coupling agents, pigments such as carbon black, and wettability modifiers and antifoaming agents such as nonionic surfactants, fluorinated surfactants and silicone fluids are added if desired.

With respect to the manufacturing process, a liquid epoxy resin composition may be prepared by fully kneading the above-mentioned ingredients in an agitating mixer such as a Shinagawa mixer. The kneading temperature is desirably 20 to 50° C. A powder epoxy resin composition may be prepared by uniformly mixing the above-mentioned ingredients in a high speed mixer and fully kneading the mixture in a twin-roll mill or continuous kneader. The kneading temperature is desirably 50 to 110° C. After kneading, the composition is thinly sheeted, cooled, and pulverized.

The resin composition of the invention is used as a general purpose molding material, especially semiconductor encapsulating material. The molding technique used herein includes transfer molding, compression molding, and injection molding. A molding temperature of 150 to 185° C. is preferable.

Various semiconductor devices can be encapsulated with the epoxy resin composition according to the invention. Inter alia, discrete devices, IC, and high integration devices such as LSI and ultra-LSI can be advantageously encapsulated.

There has been described an epoxy resin composition loaded with a unique inorganic filler which is low in melt viscosity, easy to mold, and thus effective for encapsulating a semiconductor device without causing die pad deformation and wire deformation. The semiconductor device encapsulated with the loaded epoxy resin composition thus remains highly reliable.

EXAMPLE

Examples of the present invention are given below by way of illustration and not by way of limitation. All parts are by weight.

Examples 1–3 & Comparative Examples 1–5

Each of silica fillers A to H shown in Table 1 was surface treated with 0.5% by weight of γ-glycidyloxypropyl-trimethoxysilane (KBM403 by Shin-Etsu Chemical Co., Ltd.) and examined for various properties.
Particle size distribution and mean particle size A particle size distribution was measured by a laser diffraction/scattering particle size distribution analyzer.
Specific surface area A filler was measured for specific surface area by a specific surface area tester (BET method, nitrogen adsorption).
Viscosity ratio and viscosity at 0.6 s$^{-1}$ A blend was prepared by weighing 1 gram of an epoxy resin Epikote 807 (bisphenol F type epoxy resin having an epoxy equivalent of 168 and a viscosity of 38 poises at 25° C., by Shell Chemical Co.) and 3 grams of silica and fully mixing them on a glass dish. Using an E type viscometer equipped with a rotor cone R-U (Toki Sangyo K.K.), the blend was measured for viscosity at a shear rate of 0.6 s$^{-1}$ and 10 s$^{-1}$ at a temperature of 25° C.±0.05° C. A ratio $V_1/V_2$ of the viscosity $V_1$ at a shear rate of 0.6 s$^{-1}$ to the viscosity $V_2$ at a shear rate of 10 s$^{-1}$ was calculated.

Epoxy resin compositions were prepared by blending the silica fillers in the amount shown in Table 2, followed by kneading. The resin compositions were examined for various properties.
Spiral flow A spiral flow was measured by transfer molding an epoxy resin composition at a temperature of 175° C. and a pressure of 70 kg/cm$^2$.
Gel time An epoxy resin composition was heated on a hot plate at 175° C. until the composition gelled.
Internal and external voids An epoxy resin composition was transfer molded over a quad flat package (QFP, five samples) at a temperature of 175° C. and a pressure of 70 kgf/cm$^2$. Using a ultrasonic flaw detector, the number of internal voids was counted. The number of external voids was counted by visual observation. The number of voids is a sum of voids in or on five samples.
Wire deformation An epoxy resin composition was transfer molded over a QFP with gold wires of 3 mm long connected at a temperature of 175° C. and a pressure of 70 kgf/cm$^2$. The package was observed by a soft X-ray analyzer to examine whether the gold wires were deformed.
Die pad deformation An epoxy resin composition was transfer molded over a QFP at a temperature of 175° C. and a pressure of 70 kgf/cm$^2$. The package was sectioned to examine whether the die pads were deformed.

The results are shown in Table 2.

TABLE 1

| Silica used | A | B | C | D | E | F | G | H |
|---|---|---|---|---|---|---|---|---|
| <48 μm (wt %) | 79.6 | 78.9 | 79.3 | 80.9 | 79.5 | 78.9 | 81.5 | 96.2 |
| <3 μm (wt %) | 32.0 | 30.9 | 26.8 | 30.5 | 18.0 | 17.3 | 8.5 | 45.2 |
| 0.8–3 μm (wt %) | 16.8 | 16.8 | 12.5 | 15.8 | 10.9 | 8.0 | 3.6 | 23.5 |
| 0.4–0.7 μm (wt %) | 7.3 | 10.3 | 10.3 | 6.9 | 6.8 | 5.7 | 3.9 | 13 |
| 0.05–0.3 μm (wt %) | 6.3 | 1.8 | 2.0 | 5.8 | 0.8 | 1.3 | 0.5 | 6.5 |
| Mean particle size (μm) | 22.9 | 22.0 | 21.6 | 21.8 | 24.0 | 24.8 | 26.7 | 3.8 |
| Specific surface area (m$^2$/g) | 1.8 | 1.2 | 1.3 | 1.7 | 1.4 | 1.1 | 1.0 | 3.2 |
| Viscosity ratio | 0.92 | 2.09 | 1.77 | 3.79 | 2.61 | 3.34 | 4.5 | 6.5 |
| Viscosity at 0.6 s$^{-1}$ (poise) | 11000 | 24500 | 19500 | 78000 | 54000 | 72500 | 88000 | 135000 |

TABLE 2

| Composition (pbw) | E1 | E2 | E3 | CE1 | CE2 | CE3 | CE4 | CE5 |
|---|---|---|---|---|---|---|---|---|
| Silica type | A | B | C | D | E | F | G | H |
| amount | 760 | 760 | 760 | 760 | 760 | 760 | 760 | 760 |
| YX4000HK*[1] | 12 | 12 | 12 | 12 | 12 | 12 | 12 | 12 |
| NC7000*[2] | 70 | 70 | 70 | 70 | 70 | 70 | 70 | 70 |
| Silicone-modified resin | 27 | 27 | 27 | 27 | 27 | 27 | 27 | 27 |
| TD2093*[3] | 67 | 67 | 67 | 67 | 67 | 67 | 67 | 67 |

TABLE 2-continued

| Composition (pbw) | E1 | E2 | E3 | CE1 | CE2 | CE3 | CE4 | CE5 |
|---|---|---|---|---|---|---|---|---|
| Antimony trioxide | 15 | 15 | 15 | 15 | 15 | 15 | 15 | 15 |
| BREN-S*[4] | 18 | 18 | 18 | 18 | 18 | 18 | 18 | 18 |
| Carnauba wax | 12 | 12 | 12 | 12 | 12 | 12 | 12 | 12 |
| Triphenyl-phosphine | 13 | 13 | 13 | 13 | 13 | 13 | 13 | 13 |
| Spiral flow (cm) | 91 | 102 | 105 | 88 | 101 | 95 | 85 | 65 |
| Gel time (sec.) | 24 | 24 | 24 | 24 | 24 | 24 | 23 | 23 |
| Internal voids (number) | 0 | 0 | 0 | 7 | 9 | 6 | 8 | 12 |
| External voids (number) | 0 | 0 | 0 | 2 | 1 | 3 | 2 | 4 |
| Wire deformation | no | no | no | 8 | 5.6 | 7.5 | 7 | broken |
| Die pad deformation | no | no | no | deformed | deformed | deformed | deformed | deformed |

*[1]biphenyl type epoxy resin (Yuka Shell K.K.)
*[2]naphthalene type epoxy resin (Nihon Kayaku K.K.)
*[3]phenol novolac resin (Dai-Nihon Ink Chemical Industry K.K.)
*[4]brominated novolac epoxy resin (Nihon Kayaku K.K.)

Examples 4–5 & Comparative Example 6

Epoxy resin compositions were prepared as in Example 1 but according to the formulation shown in Table 3 and examined as in Example 1. The results are shown in Table 3.

TABLE 3

| Composition (pbw) | | E4 | E5 | CE6 |
|---|---|---|---|---|
| Silica | type | A | A | A |
|  | amount | 800 | 400 | 880 |
| YX4000HK | | 42.9 | 42.9 | 42.9 |
| Mylex 3L*[5] | | 46.8 | 46.8 | 46.8 |
| Antimony trioxide | | 6 | 6 | 6 |
| BREN-S | | 4.2 | 4.2 | 4.2 |
| Carnauba wax | | 2.6 | 1.6 | 2.6 |
| Triphenylphosphine | | 1.3 | 1.3 | 1.3 |
| Spiral flow (cm) | | 110 | 175 | 68 |
| Gel time (sec.) | | 24 | 26 | 22 |
| Melt viscosity (poise) | | 143 | 49 | 285 |
| Internal voids (number) | | 0 | 0 | 13 |
| External voids (number) | | 0 | 0 | 5 |
| Die pad deformation | | no | no | deformed |
| Wire deformation | | no | no | 9.5 |

*[5]phenol aralkyl resin (Mitsui Toatsu Chemical K.K.)

Although some preferred embodiments have been described, many modifications and variations may be made thereto in the light of the above teachings. It is therefore to be understood that within the scope of the appended claims, the invention may be practiced otherwise than as specifically described.

We claim:

1. An epoxy resin composition comprising an epoxy resin, a curing agent, and an inorganic filler as essential components, characterized in that the inorganic filler satisfies that fine particles having a particle size of 3 μm or less account for 10 to 40% by weight of the entire inorganic filler, and has a particle size distribution that a finest fraction of particles having a particle size of 0.05 to 0.3 μm accounts for 1 to 10% by weight, a finer fraction of particles having a particle size of 0.4 to 0.7 μm accounts for 5 to 20% by weight, and a fine fraction of particles having a particle size of 0.8 to 3 μm accounts for 5 to 20% by weight of the entire inorganic filler, the entire inorganic filler has a mean particle size of 4 to 30 μm and a specific surface area of 2.5 $m^2$/g or less as measured by a nitrogen adsorption BET method, and when a blend of a bisphenol F type liquid epoxy resin having a viscosity of 30 to 45 poises at 25° C. as measured by Gardner-Holdt method with 75% by weight of the inorganic filler is measured for viscosity at 25° C. by means of an E type viscometer, the viscosity at a shear rate of 0.6 $s^{-1}$ is 50,000 poises or less and the ratio of the viscosity at a shear rate of 0.6 $s^{-1}$ to the viscosity at a shear rate of 10 $s^{-1}$ is 2.5/1, or less and the inorganic filler is blended in an amount of 400 to 1,000 parts by weight per 100 parts by weight of the epoxy resin and curing agent combined.

2. A semiconductor device encapsulated with a cured product of an epoxy resin composition as set forth in claim 1.

3. An epoxy resin composition as in claim 1 wherein the epoxy resin is selected from the group consisting of bisphenol A type epoxy resins, bisphenol F type epoxy resins, phenol novolak type epoxy resins, cresol novolak type epoxy resins, naphthalene type epoxy resins, biphenyl type epoxy resins, phenol aralkyl type epoxy type resins, and cyclopentadiene type epoxy resins.

4. An epoxy resin composition as in claim 1 wherein the epoxy resins have a liquid crystal structure.

5. An epoxy resin composition as in claim 3 wherein the epoxy resins have an overall chlorine content of less than 1,500 ppm.

6. An epoxy resin composition as in claim 3 wherein the curing agent is selected from the group consisting of phenol compounds, amine compounds, and acid anhydride compounds.

7. An epoxy resin composition as in claim 3 wherein the curing agent is a phenol resin used in an amount such that 0.5 to 1.6 moles of phenolic hydroxyl group is available per mole of the epoxy group.

8. An epoxy resin composition as in claim 1 wherein the fraction of particles having a particle size of 0.05 to 0.3 µm has a specific service area of 10 to 50 m$^2$/g.

9. An epoxy resin composition as in claim 1 wherein the ratio of the viscosity at a shear rate of 0.6 s$^{-1}$ to the viscosity at a shear rate of 10 s$^{-1}$ is between 0.8 and 2.2 s$^{-1}$.

10. An epoxy resin composition as in claim 1 having a melt viscosity of less than 200 poises at 175° C.

* * * * *